(12) United States Patent
DiSanto et al.

(10) Patent No.: US 7,918,703 B1
(45) Date of Patent: Apr. 5, 2011

(54) FLAT PANEL DISPLAY HAVING A CONTROL FRAME PEDESTAL AND METHOD OF MAKING SAME

(75) Inventors: Frank J. DiSanto, Melville, NY (US); Denis A. Krusos, Melville, NY (US)

(73) Assignee: Coputele, Inc., Melville, NY (US)

( * ) Notice: Subject to any disclaimer, the term of this patent is extended or adjusted under 35 U.S.C. 154(b) by 221 days.

(21) Appl. No.: 12/378,784

(22) Filed: Feb. 19, 2009

Related U.S. Application Data (62) Division of application No. 11/724,793, filed on Mar. 16, 2007, now Pat. No. 7,786,663.

(51) Int. Cl.
  *H01J 9/00* (2006.01)
  *H01L 21/64* (2006.01)
  *H01L 33/00* (2006.01)
(52) U.S. Cl. .............................. 445/23; 438/34; 257/88
(58) Field of Classification Search .............. 445/23–25; 361/681; 257/88; 438/34
See application file for complete search history.

(56) References Cited

U.S. PATENT DOCUMENTS

| 7,098,587 B2 | 8/2006 | Hofmann et al. |
| 2005/0236963 A1 | 10/2005 | Kang et al. |

*Primary Examiner* — Joseph L Williams
(74) *Attorney, Agent, or Firm* — Plevy & Keene LLP (57) ABSTRACT

A method for providing a flat panel display comprising the steps of: providing an anode assembly containing a plurality of pixels; applying a photoresist to a surface of the anode assembly; applying a mask that defines a control frame top surface; exposing the mask to UV radiation and causing the photoresist to cross link at the exposed areas of the photoresist such that the exposed photoresist is inert and does not outgas in a vacuum; removing the unexposed areas of the photoresist to define a pedestal; forming a planarizing layer over the exposed photoresist pedestal; applying a metal layer over the planarizing layer; applying a second photoresist over the metal layer; exposing portions of the second photoresist and removing excess of the metal layer and the planarizing layer to form the metal layer only on top of the exposed photoresist pedestal; and applying nanotube emitters on the metal layer.

10 Claims, 8 Drawing Sheets

FLAT PANEL DISPLAY HAVING A CONTROL FRAME PEDESTAL AND METHOD OF MAKING SAME

CROSS-REFERENCE TO RELATED APPLICATION

This application is a divisional of U.S. patent application Ser. No. 11/724,793, filed Mar. 16, 2007 now U.S. Pat. No. 7,786,663, hereby incorporated in its entirety by reference into this application.

FIELD OF THE INVENTION

This application is generally related to the field of displays and more particularly to flat panel displays using nanotubes and Thin Film Transistor (TFT) technology.

BACKGROUND OF INVENTION

Flat panel display (FPD) technology is one of the fastest growing display technologies in the world, with a potential to surpass and replace Cathode Ray Tubes (CRTs) in the foreseeable future. As a result of this growth, a large variety of FPDs exist, which range from very small virtual reality eye tools to large hand-on-the-wall television displays.

It is desirable to provide a display device that may be operated in a nanotube configuration, and that exhibits a uniform, enhanced and adjustable brightness with good electric field isolation between pixels. Such a device would be particularly useful as an FPD, such as a low voltage nanotube display, incorporating a nanotube-based electron emission system, a pixel control system, and phosphor based pixels, with or without memory.

SUMMARY OF THE INVENTION

A flat panel display comprises an anode assembly including a plurality of electrically addressable pixels and thin-film transistor driver circuits each being electrically coupled to an associated at least one of the pixels; a passivating layer on the thin-film transistor driver circuits and at least partially around the pixels; a conductive control frame disposed on the anode assembly and surrounding each pixel, the conductive control frame including an inert photoresist pedestal layer disposed on the anode assembly, a metal layer disposed on a top surface of the pedestal layer; and an emitter associated with the metal layer, wherein, exciting the conductive control frame and addressing one of the pixels using the associated driver circuit causes the emitter to emit electrons that induce the one of the pixels to emit light.

In another aspect of the invention, a method for providing a flat panel display comprising the steps of: providing an anode assembly containing a plurality of pixels; applying a photoresist to a surface of the anode assembly; applying a mask that defines a control frame top surface; exposing the mask to UV radiation and causing the photoresist to cross link at the expose areas of the photoresist such that the exposed photoresist is inert and does not outgas in a vacuum; removing the unexposed areas of the photoresist to define a pedestal; forming a planarizing layer over the exposed photoresist pedestal; applying a metal layer over the planarizing layer; applying a second photoresist over the metal layer; exposing portions of the second photoresist and removing excess of the metal layer and the planarizing layer to form the metal layer only on top of the exposed photoresist pedestal; and applying nanotube emitters on the metal layer.

In still another aspect, an article for a flat panel display comprises: a control frame formed by applying a photoresist to a surface of an assembly of pixels; applying a mask that defines the frame top surface; illuminating the mask with ultraviolet (UV) radiation to cross link the photoresist; depositing a metal onto the photoresist; depositing nanotubes onto the metal; and removing any excess metal and photoresist to form the control frame.

BRIEF DESCRIPTION OF THE DRAWINGS

It is to be understood that the accompanying drawings are solely for purposes of illustrating the concepts of the invention and are not drawn to scale. The embodiments shown in the accompanying drawings, and described in the accompanying detailed description, are to be used as illustrative embodiments and should not be construed as the only manner of practicing the invention. Also, the same reference numerals, possibly supplemented with reference characters where appropriate, have been used to identify similar elements.

DETAILED DESCRIPTION OF THE INVENTION

It is to be understood that the figures and description of the present invention have been simplified to illustrate elements that are relevant for a clear understanding of the present invention, while eliminating, for the purpose of clarity, many other elements found in typical FPD systems and methods of making and using the same. Those of ordinary skill in the art may recognize that other elements and/or steps are desirable and/or required in implementing the present invention. However, because such elements and steps are well known in the art, and because they do not facilitate a better understanding of the present invention, a discussing of such elements and steps is not provided herein.

Before embarking on a more detailed discussion, it is noted that passive matrix displays and active matrix displays are FPDs that are used extensively in various display devices, such as laptop and notebook computers, for example. In a passive matrix display, there is a matrix of solid-state elements in which each element or pixel is selected b applying a potential voltage to a corresponding row and column line that forms the matrix. In an active matrix display, each pixel is further controlled by at least one transistor and a capacitor that is also selected by applying a potential to a corresponding row and column line. Part of the invention lies in the recognition that a TFT-based display device with a control frame disposed thereon exhibits enhanced performance and effects useful for display devices. Electron emission sources may be used with such a frame to form a cold cathode configuration, such as one including edge emitters and/or nanotube emitters.

According to an aspect of the present invention, a pixel matrix control system having a control frame around each pixel associated with a thin film transistor (TFT) circuit of a display device is used to provide a display characterized as having a good uniformity, adjustable brightness, and a good electric field isolation between pixels, regardless of the type of electron source used. For purposes of completeness, a TFT is a type of field effect transistor made by depositing thin films for the metallic contacts, semiconductor active layer, and dielectric layer. TFT's are widely used in liquid crystal display (LCD) FPDs.

The control frame surrounds the pixel and creates a requisite electric field to direct electrons emitted from the cathode. The TFT is disposed in an inactive area between the pixels (e.g. on an insulating substrate over the respective columns and rows). The control frame can accommodate carbon nanotube electron emission structures, and be suitable for operation at low voltages, such as voltages of less than around 40 volts. In an exemplary configuration, the device operates as a thin nanotube display.

According to an aspect of the present invention the electron emitting structures take the form of nanotubes, such as carbon nanotubes. The diameter of a nanotube is typically on the order of a few nanometers. According to an aspect of the present invention, single-wall carbon nanotubes (SWNTs) and/or multiple wall carbon nanotubes (MWNTs) may be used.

According to an aspect of the present invention, the control frame includes a plurality of conductors, typically arranged in a matrix having parallel horizontal conductors and parallel vertical conductors. Each pixel is bounded by the intersection of vertical and horizontal conductors, such that the conductors surround the corresponding pixels to the right, left, top and bottom in a matrix fashion. One or more conductive pads are electrically connected to the control frame. The control frame may be fabricated of a metal including, for example, chrome, molybdenum, aluminum (Al) and/or combinations thereof.

According to an aspect of the present invention, the control frame can be formed using standard lithography, deposition and etching techniques.

In one exemplary configuration, conductors parallel to columns and rows are electrically connected together, and a voltage is applied thereto. In another exemplary configuration together, and a voltage is applied thereto. Conductors parallel to the rows are also connected together, with a voltage applied thereto. In yet another exemplary configuration, a voltage is only applied to one of the parallel rows or columns of conductors.

According to an aspect of the present invention, a vacuum FPD incorporating a TFT circuit may be provided. Associated with each pixel element is a TFT circuit may be provided. Associated with each pixel element is a TFT circuit that is used to selectively address that pixel element in the display. In one configuration the TFT circuit includes first and second active devices electrically cascaded, and a capacitor coupled to an output of the first device and an input of the second device.

Figure 1:
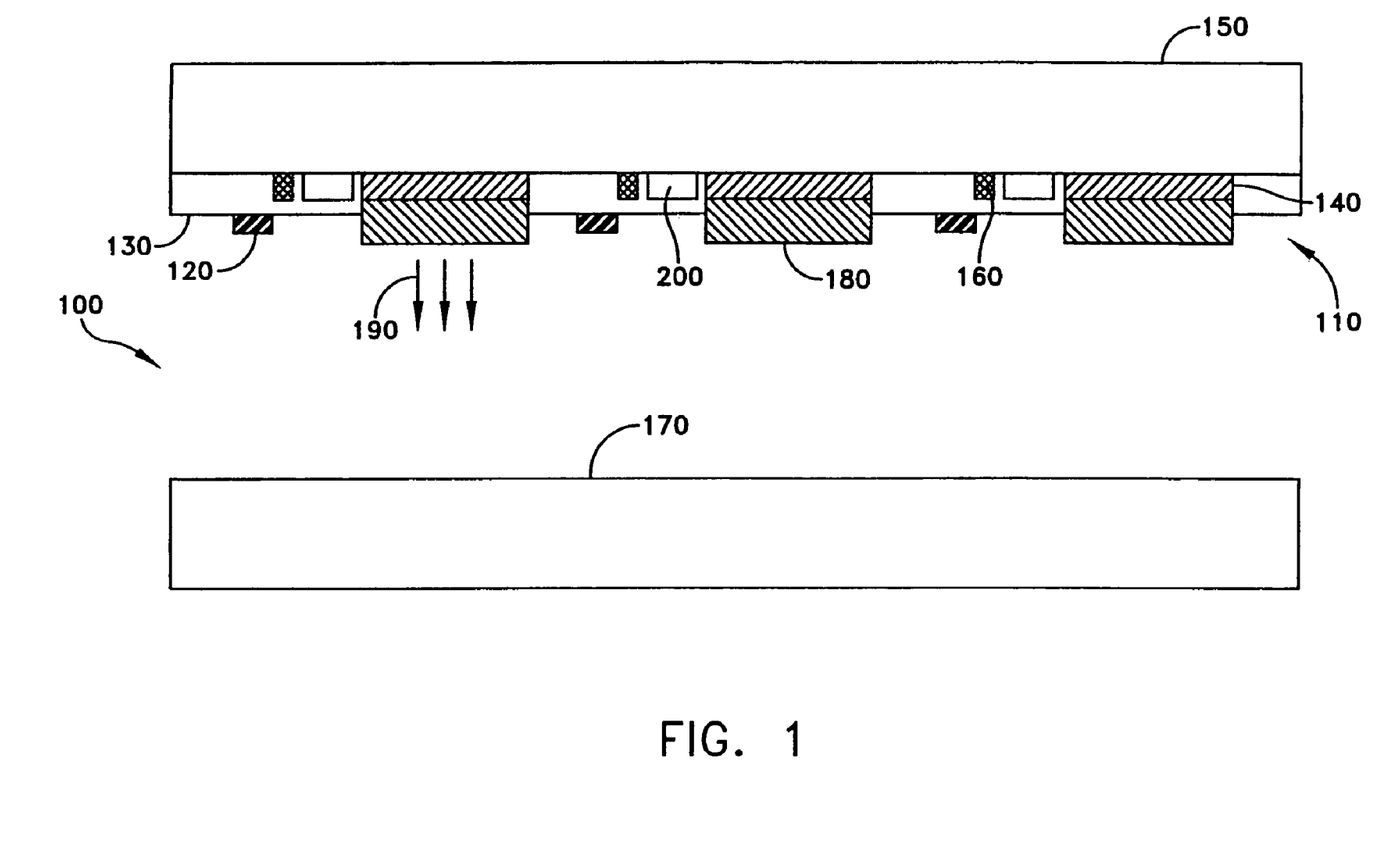
FIG. 1 illustrates an exemplary display device according to an aspect of the present invention.

Referring now to the figures, FIG. 1 illustrates a schematic cross-sectional view of a TFT anode based FPD 100 according to an aspect of the present invention. In the explemplary embodiment, display 100 is composed of an assembly 110 that includes an anode and that employs TFT circuitry to control the attraction of electrons, and a control frame structure 120 disposed on anode passivation layer 130. The control frame structure substantially surrounds each of the pixel elements, and in one configuration supports electron emitting nanotubes. In the illustrated embodiment, the pixel metal 140 operates as the anode, which attracts electrons emitted by the frame supported emitters.

Assembly 110 includes a plurality of conductive pads 140 fabricated in a matrix of substantially parallel rows and columns on a substrate 150 using conventional fabrication methods. Substrate 150 may be formed of a transparent material, such as glass, or a flexible material (such as a plastic with no internal outgassing) but may be opaque. Substrate 170, which serves to confine the FPD housing in an evacuated environment may also be made of a transparent (or at least translucent) material, such as glass or flexible material, but alternatively may be opaque. Substrate 170, which serves to confine the FPD housing in an evacuated environment may also be made of a transparent (or at least translucent) material, such as glass or flexible material, but alternatively may be opaque. Conductive pads 140 may be composed of a transparent conductive material, such as ITO (Indium Titanium Oxide) or non-transparent conductor such as Chrome (Cr), Moly Chrome (MoCr) or aluminum.

Deposited on each conductive pad 140 is phosphor layer 180. Each phosphor layer(s) 180 is selected from materials that emit light 190 of a specific color, wavelength, or range of wavelengths. In a conventional RGB display, phosphor layer 180 is selected from materials that produce red light, green light or blue light when struck by electrons. In the illustrated embodiment, light (i.e., photos) is emitted in the direction of substrate 170 for viewing. If the pixel metal is of a transparent (or translucent) material (such as ITO) rather than opaque, light emissions 190 would be transmitted in both directions of substrates 150 and 170 (rather than being reflected via the pixel metal to substrate 170 only, for example).

Incorporated in the TFT circuit are conductive pixel column and row addressing lines associated with each of the corresponding conductive pads 140. The pixel row and column addressing lines may be substantially perpendicular to one another. Such a matrix organization of conductive pads and phosphor layers allows for X-Y addressing of each of the individual pixel elements in the display as will be understood by those possessing an ordinary skill in the pertinent arts.

Associated with each conductive pad 140/phosphor layer 180 is a TFT circuit 200 that operates to apply an operating voltage to the associated conductive pad 140/phosphor layer 180 pixel element. TFT circuit 200 is driven via row/column matrix 160 (formed by conductors at right angles) for example, and operates to apply either a first voltage to bias an associated pixel element to maintain it in an "off" state or a second voltage to bias the associated pixel element to maintain it in an "on" state, or any intermediate state. In this illustrated case, conductive pad 140 is inhibited from attracting electrons when in an "off" state, and attracts electrons when in an "on" or any intermediate state.

TFT circuitry 200 biasing conductive pad 140 provides for the dual functions of addressing pixel elements and maintaining the pixel elements in a condition to attract electrons for a desired time period, i.e., time-frame or sub-periods of timeframe.

Figure 2:
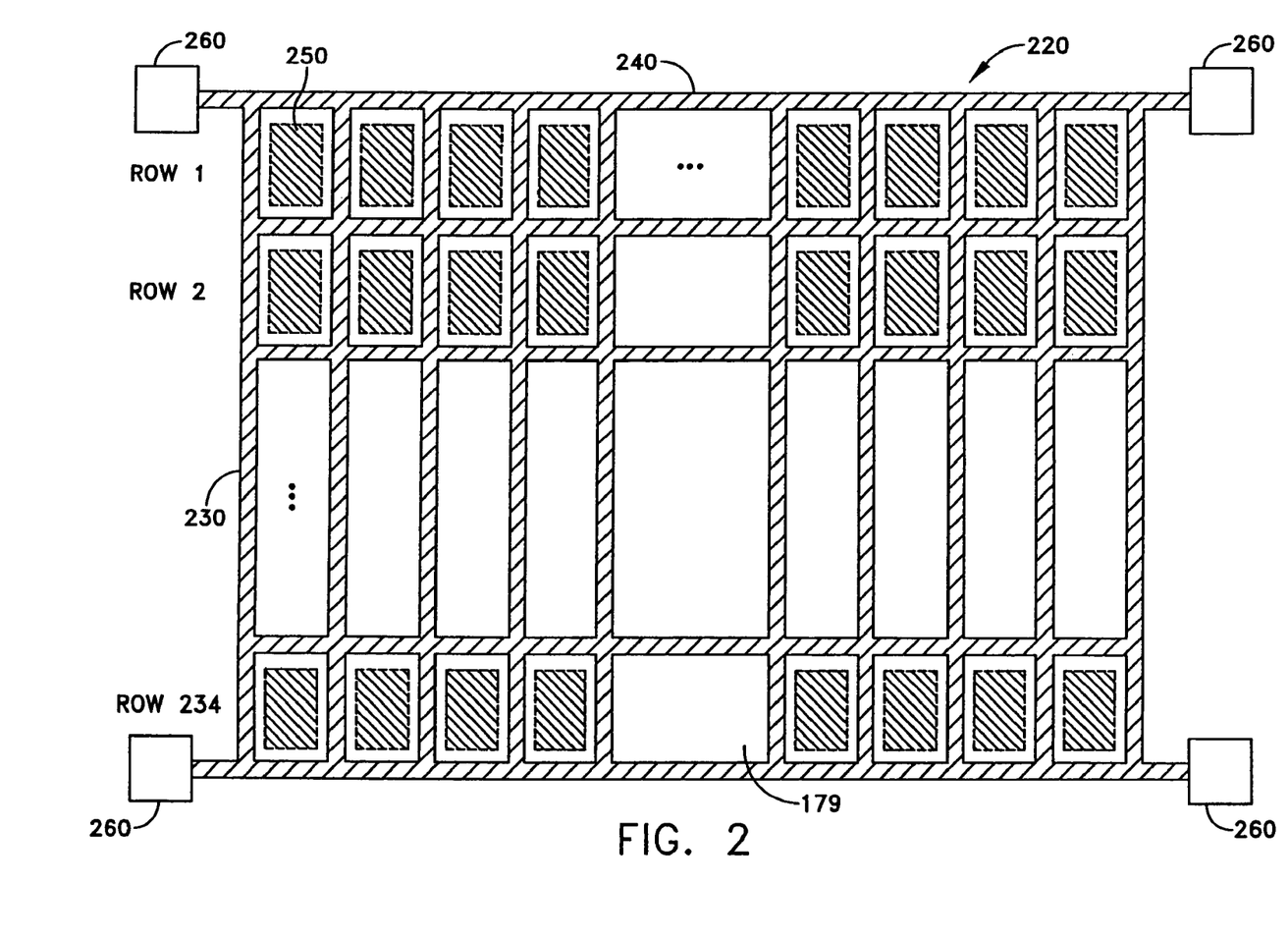
FIG. 2 illustrates a control frame around each pixel and having a fixed voltage according to an aspect of the present invention.

Referring now also to FIG. 2, there is shown a plan view of a control frame structure 220 suitable for use as control frame structure 120 of FIG. 1. Control frame structure 220 includes a plurality of conductors arrange in a rectangular matrix having parallel vertical conductive lines 230 and parallel horizontal conductive lines 240, respectively. Each pixel 250 of FIG. 2 (e., pad 140 and phosphor 180 of FIG. 1) is bounded by vertical and horizontal conductors or lines 230, 240, such that the conductors substantially surround each pixel 250 to the right, left, top, and bottom. One or more conductive pads 260 electrically connect conductive frame structure 220 to a conventional power source. In the illustrated embodiment of FIG. 2, four conductive pads 260 are coupled to the conductive lines 230, 240 of frame structure 220. In an exemplary embodiment, each pad 260 is around 100×200 micrometers (microns) in size.

In the illustrated embodiment of FIG. 2, control frame structure 220 is formed as metal layer 230/240 (referred to hereinafter as 230) disposed on an insulating frame pedestal 520 (see e.g. FIG. 4b and FIG. 5c) and above the final passivation layer (e.g. 130, FIG. 1). Pads 260 and metal lines that provide the control frame structure 220 remain free from passivation in the illustrated embodiment of FIG. 2. In an exemplary configuration, the control frame metal layer has a thickness of less than about 7 microns (μm), and a width on the order of about 4-8 microns, although other thickness and widths may be used depending on particular design objectives.

Figure 4A:
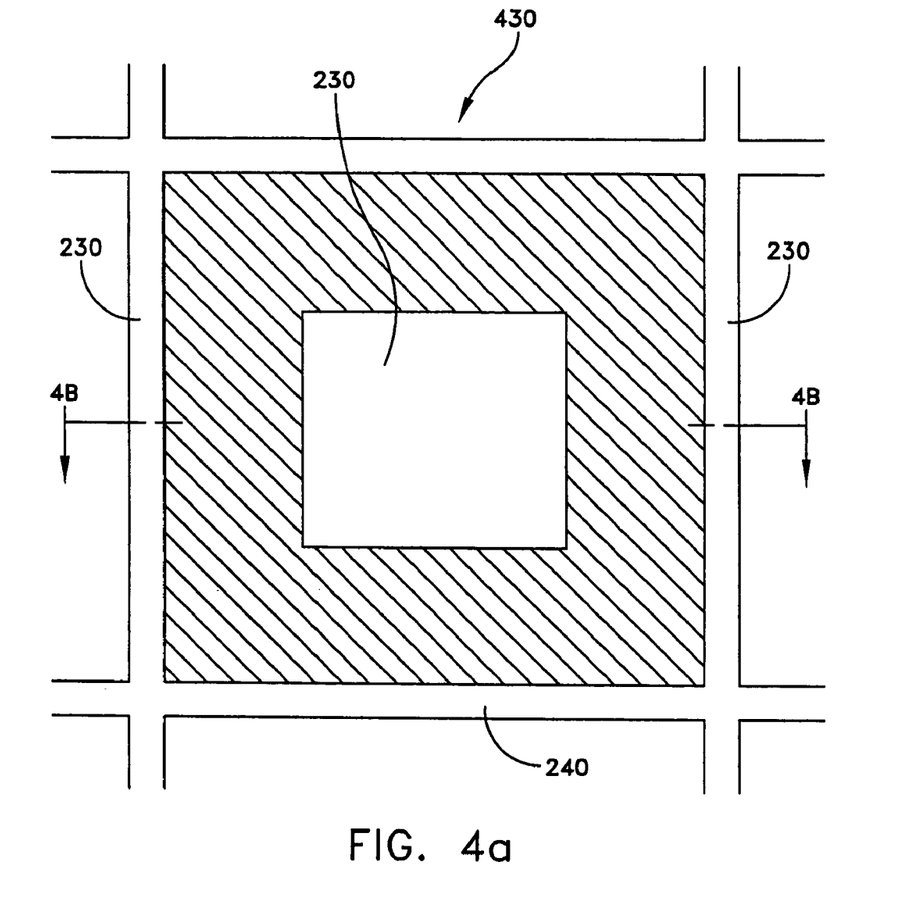
FIG. 4a illustrates a top view of a control frame surrounding a pixel according to aspect of the present invention.
Figure 4B:
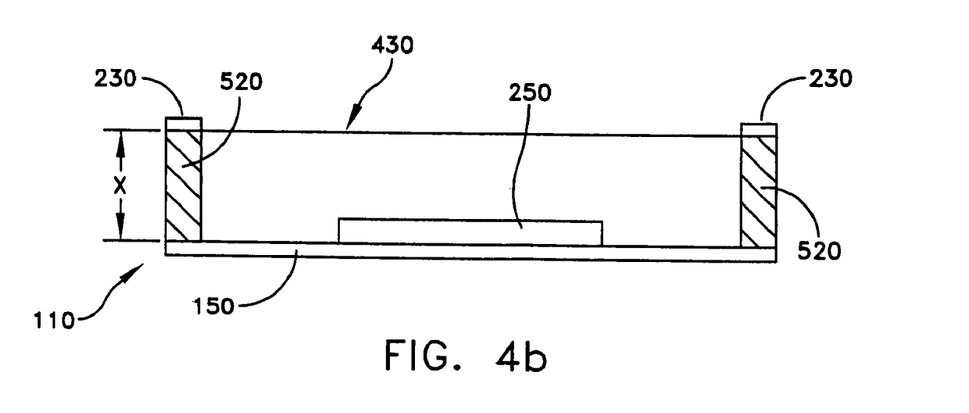
FIG. 4b illustrates a side view through section A-A of the control frame according to an aspect of the present invention.

Referring to FIG. 4a and FIG. 4b, there is shown a portion of the conductive control frame structure 220 of FIG. 2, wherein a conductive control frame assembly 430 surrounds a corresponding pixel 250. The conductive control frame assembly 430 may comprise nanotubes (not shown), which control the electrons that activate the phosphor coating on the pixels. While the conductive control frame assembly 430 is shown as rectangular or square in shape surrounding the pixel it can be of another shape as long as it surrounds the pixel 250 and provides a suitable opening to expose the pixel phosphor.

Referring now to the exemplary embodiments of FIG. 4a and FIG. 4b, in conjunction with FIG. 1, conductive control frame assembly 430 is formed from a negative photoresist coating layer that does not outgas in a vacuum of $10^{-5}$-$10^{-7}$ torr, such as a 7-10 μm thick layer of photoresist 520 (FIG. 4b), spun over assembly 110 (FIG. 1). In the embodiment shown in FIG. 4b, the layer dimensions of the insulator frame pedestal (resist layer) 520 and metal 230 are of height X equal to about 7-10 μm, and a width of about 4 μm wide. The resist layer 520 may derive from an SU-8 photoresist product (SU-8 is a commercial negative-tone photoresist supplied from MicroChem Corp. of Newton, Mass.). SU-8 resists have high functionality, high optical transparency and are sensitive to UV (including near UV) radiation. SU-8 (formulated in GBL) (gamma butyl rolacetone solvent) and SU-8 2000 (formulated in cycolopentanone) are chemically amplified, epoxy based negative resists. They can be used to provide thickness of 1 μm to 200 μm. As shown schematically in FIG. 4b, the conductive control frame including the frame pedestal 520 and frame metal 230 on substrate 150 extends vertically above the height of the pixel 250, according to an embodiment of the present invention.

Figure 5A:
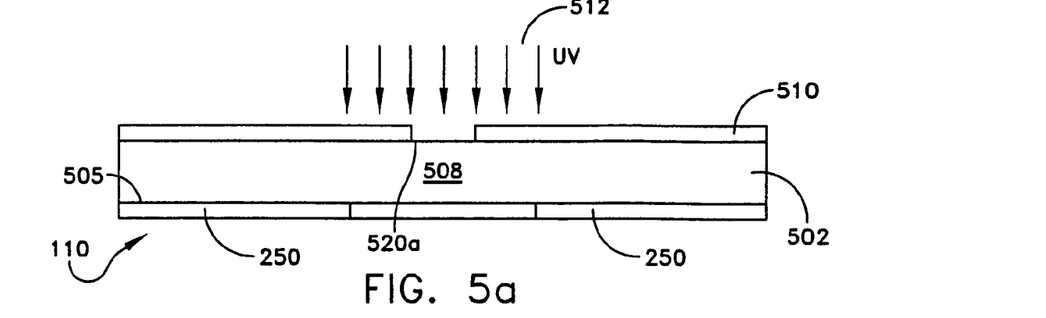
FIGS. 5a-5i illustrate schematic side sectional views of various stages of control frame fabrication according to aspects of the present invention.
Figure 5B:
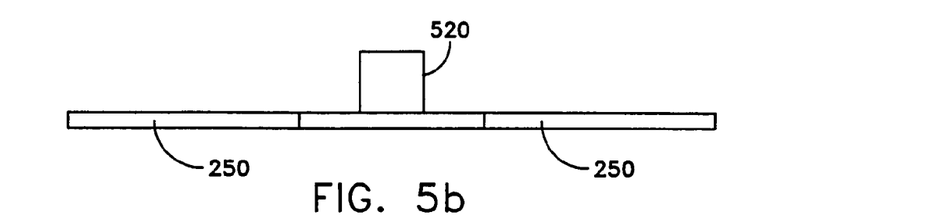
Figure 5C:
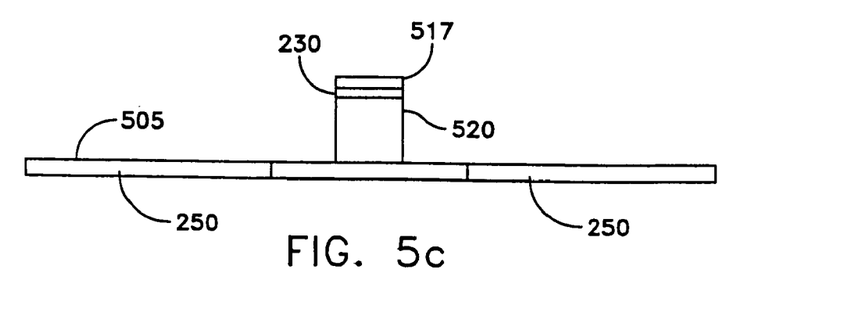
Figure 5D:
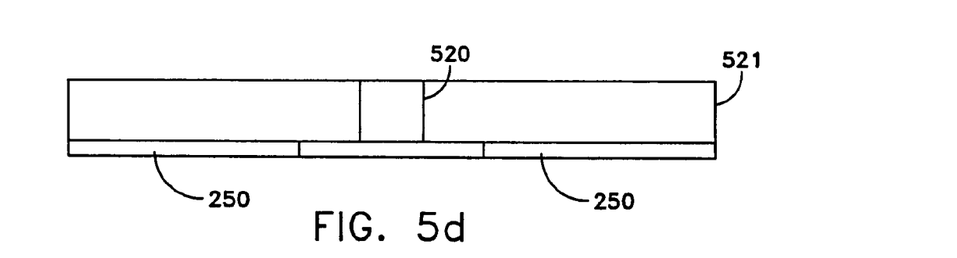
Figure 5E:
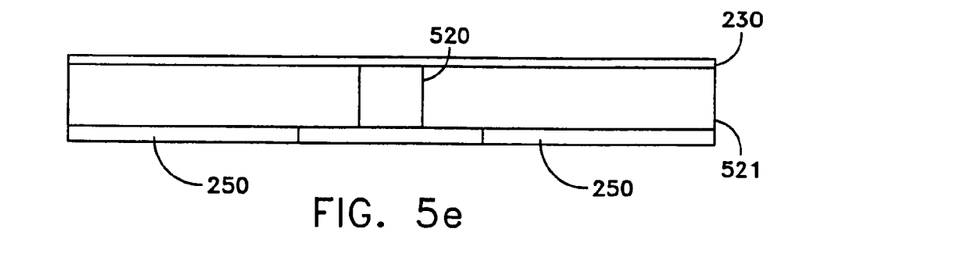
Figure 5F:
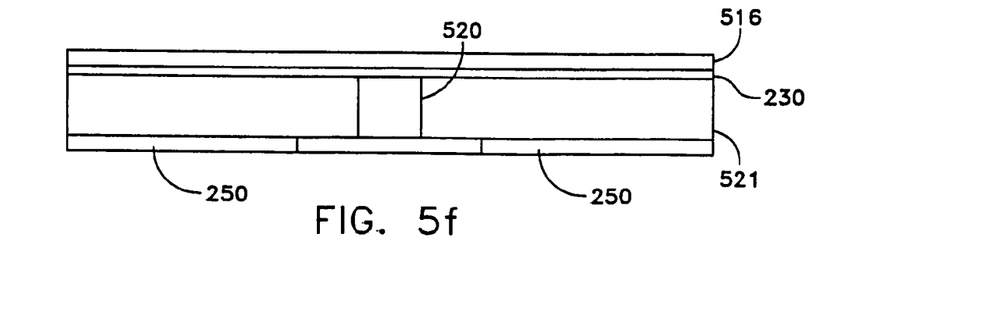
Figure 5G:
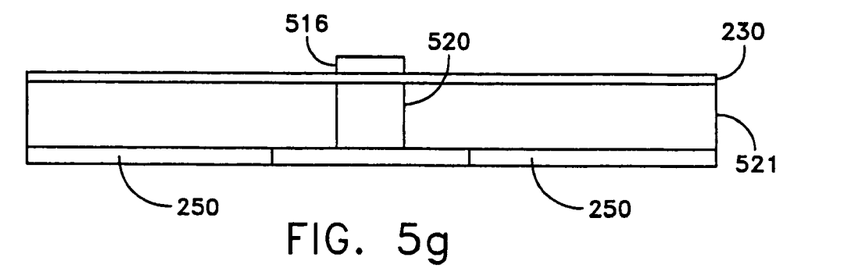
Figure 5H:
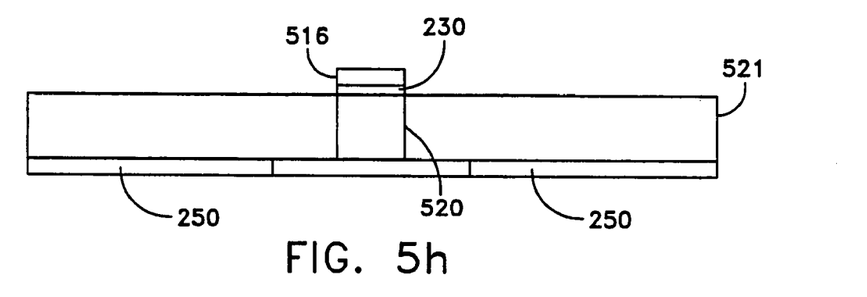
Figure 5I:
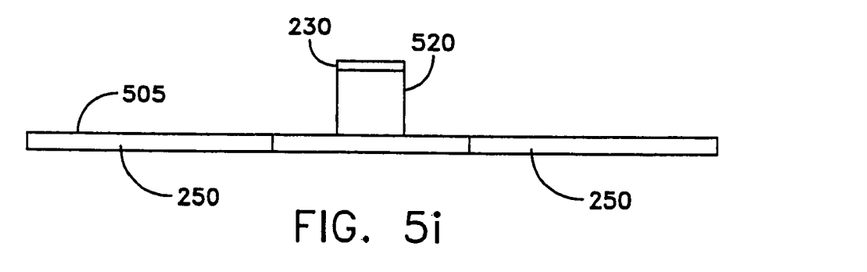
Figure 6:
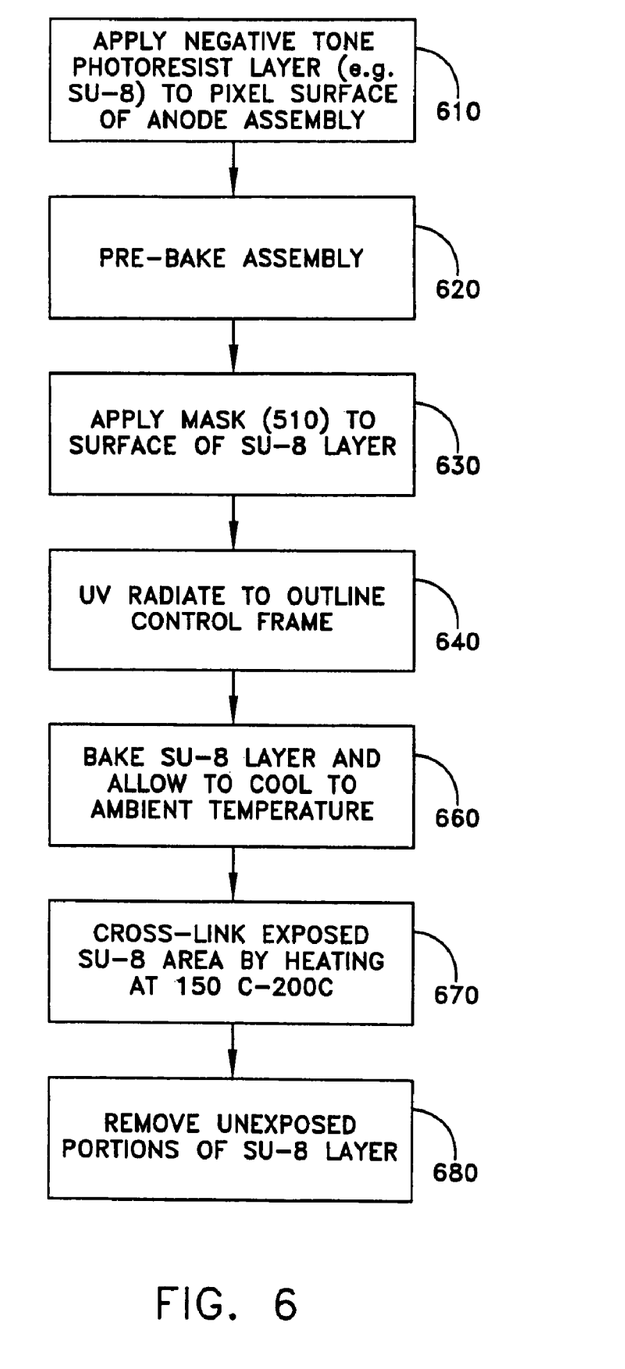
FIGS. 6-7 illustrate operational process flows for fabricating a conductive control frame according to an embodiment of the present invention.
Figure 7:
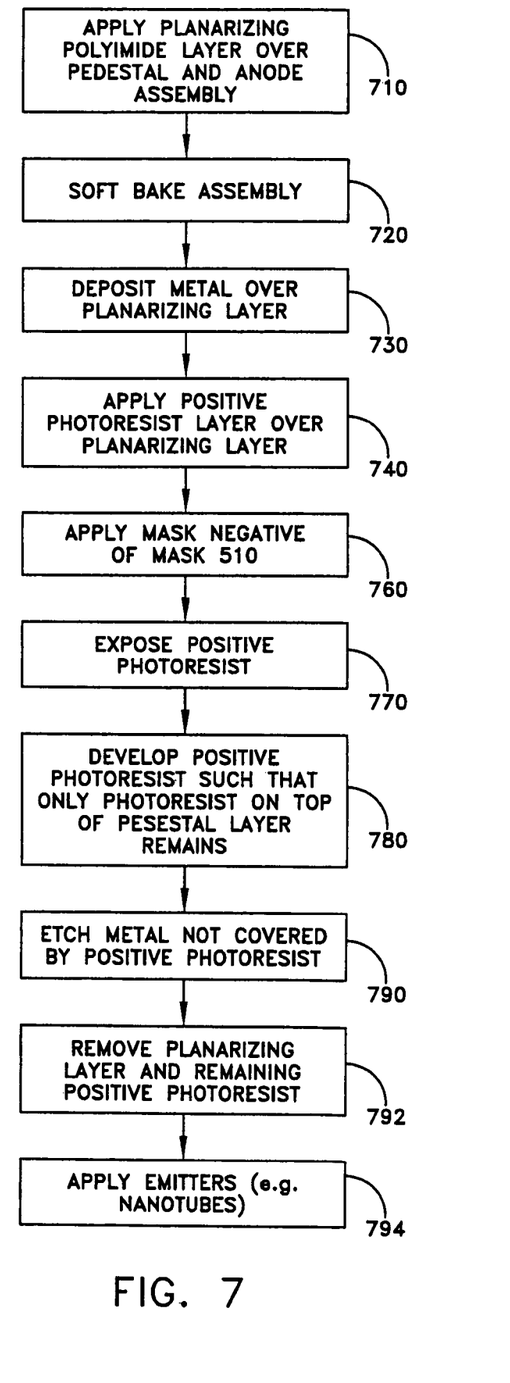

FIGS. 5a-5i in conjunction with operational flows of FIG. 6 and FIG. 7 illustrate a series of steps and structures resulting in the formation of a control frame pedestal 520 (FIG. 5c) coated with a metal layer 230 and nanotubes 517 formed by applying photoresist in combination with the aforementioned metal layer and nanotubes.

As seen in FIG. 5a, layer 502 of SU-8 (e.g. 7-10 μm thick layer) is applied using a spin coat process to the surface 505 of node assembly 110 having an array of pixels 250 (FIG. 6, Step 610). In a preferred processing operation, the anode assembly 110 and layer 502 are pre-baked at 65° C. for one minute and then at 95° C. for ten minutes (FIG. 6, Step 620). The pre-baked layer 502 is then exposed to UV radiation 512 (FIG. 5a) for about one minute through an appropriate mask 510 that outlines or defines the intended control frame patters (FIG. 6, Steps 630, 640). After UV exposure, the layer 502 is further baked by ramping the layer temperature from 65° C. to 95° C. for about three minutes. The baked layer 502 is then allowed to cool to ambient temperature (FIG. 6, Step 660) and the exposed area (520a of FIG. 5a) is then crosslinked by heating to between 150° C. and 200° C. for between 12 to 15 minutes (FIG. 6, Step 670). In this manner, the SU-8 pedestal 520 is inert and does not outgas in a vacuum. Following the foregoing bake steps the unexpected SU8 will be removed (FIG. 6, Step 680), thereby providing for an SU8 pedestal frame 520 surrounding each pixel 250 in the array of pixels (see FIG. 5b).

In order to form the assembly illustrated in FIG. 5c having an SU8 pedestal 520 with a metal surface 230 having nanotubes 517 thereon to create the requisite electric field, a planarizing layer of polymide 521 (see FIG. 5d) is applied to the structure of FIG. 5b using a spincast process (FIG. 7, Step 710) and soft baked at approximately 95° C. (FIG. 7, Step 720). A metal deposition step (FIG. 7, Step 730) applies a metal layer (e.g. from about 0.1 micron to about 0.2 micron chromium (CR) or Aluminum (AL) layer) 230 (see FIG. 5e) to the top surface of the polymide layer 521 (FIG. 5e). Following the deposition of the chromium (or aluminum) metal surface 230, a layer of positive photoresist 516 (see FIG. 5f) is applied using a spin coat process (FIG. 7, Step 740). After soft baking the positive photoresist, the positive photoresist is exposed using negative of mask 510 (FIG. 7, Steps 760, 770). The positive photoresist is then developed (FIG. 7, Step 780) such that only the photoresist covering the metal 230 on top of the pedestal 520 remains (FIG. 5g). The metal 230 not covered by the photoresist is then etched b conventional means (FIG. 7, Step 790) as is well known by those of ordinary skill in the art such that only the metal portion 230 above pedestal 520 remains (FIG. 7, Step 792) by conventional means as is well known by those of ordinary skill in the art (FIG. 5i). The nanotubes 517 are then applied (FIG. 7, Step 794) to the control frame using any conventional methodology, such as spraying, growth, electrophoresis, or printing, for example. The nanotubes may take the form of carbon nanotubes, SWNTs or MWNTs for example.

The process as illustrated in FIG. 5 produces the flat panel display illustrated in FIG. 1 having walls extending a predetermined vertical distance above the plane of the plurality of electrically addressable pixels 250 (see e.g. FIG. 4b); the conductive control frame pedestal 520 surrounding each pixel formed by applying the photoresist layer 502 of SU-8 to the surface of the assembly of pixels; applying mask 510 that outlines or defines the frame top surface; illuminating the mask 510 with UV radiation 512 to cross link the photoresist; depositing a metal layer onto the top surface of the layer 502 and depositing nanotubes 517 onto the metal layer and removing any excess metal and photoresist forms the conductive frame assembly 430.

In operation, a negative voltage (either DC or pulsed) applied to the conductive control frame 220 (FIG. 2) relative to the pixel provides the necessary threshold voltage required to create a field necessary to cause the nanotubes to start emitting electrons. As the voltage on the pixel 250 increases, as a function of the amplitude of the data to be displayed, the nanotubes emit electrons. The emitted electrons follow the field lines and strike the phosphor causing the phosphor to emit light. The light is emitted as electrons associated with the phosphor molecules, which were dislodged from their orbit around the nucleus, by the electrons emitted by the nanotubes, return to their correct position.

While the vertical line conductors 230 and horizontal line conductors 240 frame each pixel 250 above the plane of the pixels 250 in the illustrated embodiments (see, e.g., FIG. 2), other configurations are contemplated, such as where the conductors are disposed in the same plane as the pixels. Further yet, conductors 230, 240 may be connected in a number of configurations. For example, in one configuration, all horizontal and vertical conductors are joined together as shown in FIG. 2 and a voltage is applied to the entire control frame configuration. In another configuration, all horizontal conductors 240 are joined and separately all vertical conductors 230 are joined. In this connection configuration the horizontal conductors 240 and vertical conductors 230 are not electrically interconnected. Thus, a voltage may be applied to the horizontal conductor array, and a separate voltage may be applied to the vertical conductor array. Other configurations are also contemplated, including for example, a configuration of all horizontal conductors only, or a configuration of all vertical conductors only. For example, the control frame may include only metal lines parallel to the columns or only metal lines parallel to the rows.

Regardless of the particulars, a DC or pulsed voltage ($V_{TN}$) equal to ($V_{PIXEL(low)}$-($V_{THN}$)) may be applied to the frame via pads 260, where ($V_{THN}$) represents the nanotube emitting threshold and $V_{PIXEL(low)}$ represents the minimum pixel voltage. This voltage may serve to keep the frame supported nanotubes to just below the emitting threshold when the pixel voltage is in it's "OFF" state. This permits the pixel voltage to transition from the "OFF" state to the "ON" state and all voltages in between to cause in brightness (Gray Scale).

The anode (pixel) voltage ($V_{PIXEL}$) of each pixel determines the brightness or color intensity of that pixel. By positively biasing the pixel voltage ($V_{PIXEL}$) relative to the voltage of the frame, the voltage on that pixel is increased beyond the emitting threshold of the nanotubes ($V_{THN}$), such that the frame supported nanotubes in the region around a biased pixel are caused to emit electrons, which are then attracted to the positively biased pixel. In other words, when the voltage applied to the pixel ($V_{PIXEL}$) relative to the voltage applied to the control frame nanotubes ($V_{TN}$), exceeds the emission threshold voltage ($V_{THN}$), electrons are emitted from the nanotubes. The electrons emitted from the nanotubes move the anode (phosphor), thereby causing the phosphor to emit light ($V_{PIXEL}$-$V_{TN} \geq V_{THN}$). The wavelength of the emitted light depends upon the phosphor. The electron flow to the anode (i.e. pixel current) is a function of the pixel voltage, thereby producing an illumination, which is proportional to the amplitude of column data, when the voltage signal applied to the pixel is proportional to the amplitude of the data.

Figure 3:
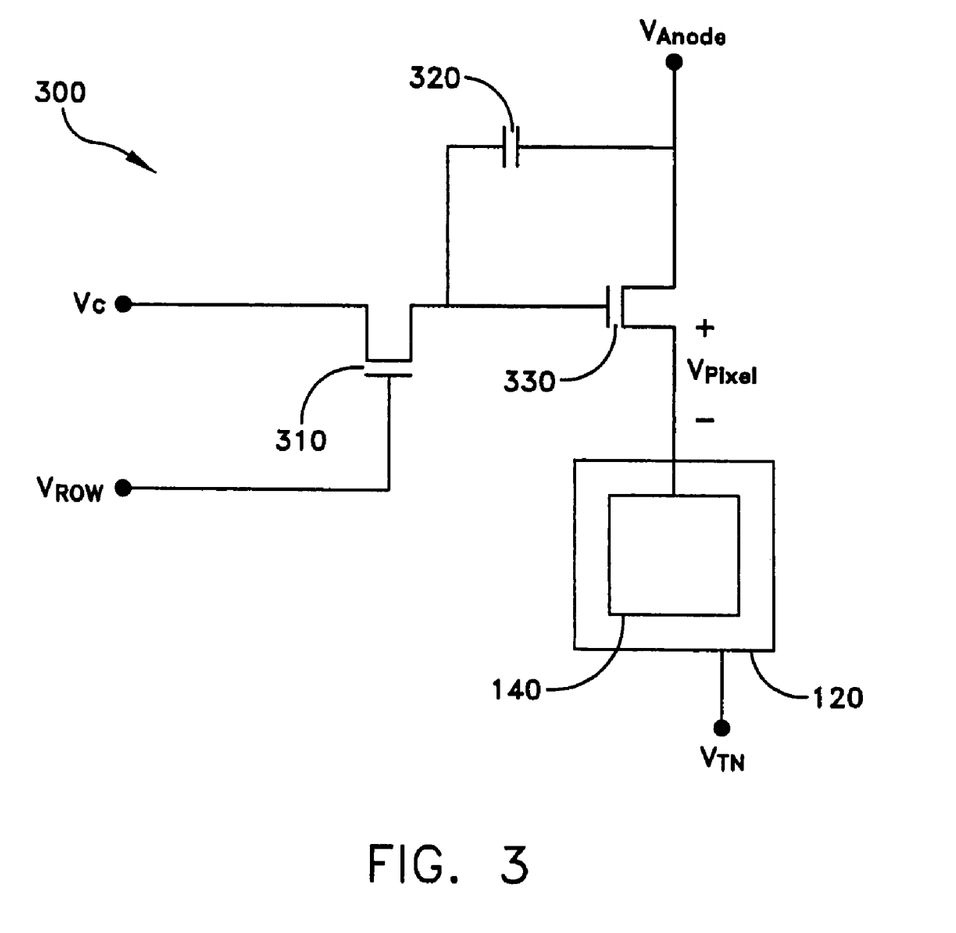
FIG. 3 illustrates a circuit for driving the control frame of FIG. 2 according to an aspect of the present invention.

According to an aspect of the present invention, control of one or more of the TFTs associated with the display device of the present invention may be accomplished using the circuit 300 of FIG. 3. Circuit 300 includes first and second transistors 310, 330 and capacitor 320 electrically interconnect with a pixel, e.g., pad 140, FIG. 1.

In general, the voltage used to select the row ($V_{ROW}$) is equal to the fully "on" voltage of the column (Vc). The row voltage in this case causes the pass transistor 310 to conduct. The resistance of pass transistor 310, capacitor 320 and the write time of each selected pixel row determines the voltage at the gate of transistor 330, as compared to Vc. Using a voltage $V_{ROW}$ higher than the fully "on" voltage (Vc) increases the conduction of transistor 310, reducing its resistance and resulting in an increase in pixel voltage ($V_{PIXEL}$) and enhanced brightness. Thus, the selection voltage for the row may be higher than the highest column voltage, thereby causing transistor 310 to turn on heavily, thereby reducing the associated resistance and providing a greater voltage on the gate of transistor 330. $V_{ANODE}$ is the power supply voltage, and may be on the order of about 40V. In such a configuration, $V_{PIXEL\ LOW}$ may be on the order of around 6-12 V.

While there has been shown, described, and pointed out fundamental novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention. For example, the control frame described previously may be used with any display which uses electrons generated by any source or charged particles to form an image, such as an a nanotube display, Electrophoretic, or VFD display. As discussed above, it is also understood that the present invention may be applied to flexible displays in order to form an image thereon.

It is expressly intended that all combinations of those elements that perform substantially the same function in substantially the same way to achieve the same results are within the scope of the invention. Substitutions of elements from one described embodiment to another are also fully intended and contemplated.

What is claimed is:

1. A method for providing a flat panel display comprising the steps of:
    providing an anode assembly containing a plurality of pixels;
    applying a photoresist to a surface of said anode assembly;
    applying a mask that defines a control frame top surface;
    exposing the mask to UV radiation and causing the photoresist to cross link at the exposed areas of the photoresist such that said exposed photoresist is inert and does not outgas in a vacuum;
    removing the unexposed areas of the photoresist to define a pedestal;
    forming a planarizing layer over the exposed photoresist pedestal;
    applying a metal layer over the planarizing layer;
    exposing portions of said second photoresist and removing excess of said metal layer and said planarizing layer to form said metal layer only on top of said exposed photoresist pedestal; and
    applying nanotube emitters on said metal layer.

2. The method of claim 1, wherein the step of exposing the mask to UV radiation and causing the photoresist to cross link at the exposed areas of the photoresist further comprises:
    exposing to said UV radiation for about one minute; heating said photoresist to about 95° C. for a given time;
    cooling said heated photoresist to ambient temperature; and heating said cooled photoresist to between 150° C. and 200° C. for another given time such that said crosslinked photoresist pedestal is inert and does not outgas in a vacuum.

3. The method of claim 1, wherein said photoresist is a layer of SU-8.

4. The method of claim 1, wherein the step of exposing portions of said second photoresist and removing excess of said metal layer and said planarizing layer to form said layer only on top of said exposed photoresist pedestal layer further comprises;
    applying a negative of said mask before exposing said portions of said second photoresist; developing said second photoresist after exposure such that only said second photoresist on top of said exposed photoresist pedestal layer remains;

etching the portion of the metal layer exposed by developing said second photoresist; and removing the remaining portion of the second photoresist and the planarizing layer.

5. The method of claim 1, wherein the metal layer comprises Chromium or Aluminum.

6. An article for a flat panel displaying comprising:
a control frame formed by applying a photoresist to the surface of an assembly of pixels;
applying a mask that defines the frame top surface; illuminating the mask with UV radiation to cross link the photoresist;
depositing a metal onto photoresist;
depositing nanotubes onto the metal; and
removing any excess metal and photoresist to form the control frame.

7. The article of claim 6, wherein said frame has walls extending a given distance above the plane of the surrounded pixel.

8. The article of claim 6, wherein said frame has a height of less than about 10 microns and a width of about 8 microns.

9. The article of claim 6, wherein said photoresist is a negative-tone photoresist sensitive to UV radiation.

10. The article of claim 9, wherein said photoresist is formulated in one of GBL and cyclopentanone.

\* \* \* \* \*

UNITED STATES PATENT AND TRADEMARK OFFICE
CERTIFICATE OF CORRECTION

| | | |
|---|---|---|
| PATENT NO. | : 7,918,703 B1 | Page 1 of 1 |
| APPLICATION NO. | : 12/378784 | |
| DATED | : April 5, 2011 | |
| INVENTOR(S) | : F. DiSanto and D. Krusos | |

It is certified that error appears in the above-identified patent and that said Letters Patent is hereby corrected as shown below:

On the Title Page, Item (73) delete the name of "Coputele, Inc." and replace with Copytele, Inc.

Signed and Sealed this
Thirty-first Day of May, 2011

David J. Kappos
*Director of the United States Patent and Trademark Office*